(12) United States Patent  (10) Patent No.: US 7,834,544 B2
Matsuura et al.  (45) Date of Patent: Nov. 16, 2010

(54) ORGANIC ELECTROLUMINESCENT DISPLAY DEVICE HAVING A MOISTURE-PROOF FILM

(75) Inventors: Toshiyuki Matsuura, Mobara (JP); Masahiro Tanaka, Chiba (JP)

(73) Assignee: Hitachi Displays, Ltd., Chiba (JP)

( * ) Notice: Subject to any disclaimer, the term of this patent is extended or adjusted under 35 U.S.C. 154(b) by 314 days.

(21) Appl. No.: 11/774,649

(22) Filed: Jul. 9, 2007

(65) Prior Publication Data

US 2008/0007163 A1  Jan. 10, 2008

(30) Foreign Application Priority Data

Jul. 7, 2006  (JP) .............................. 2006-187673

(51) Int. Cl.
*H01J 1/62* (2006.01)

(52) U.S. Cl. ..................... 313/506; 313/509; 313/512

(58) Field of Classification Search .......... 313/498–512
See application file for complete search history.

(56) References Cited

U.S. PATENT DOCUMENTS

2005/0285521 A1* 12/2005 Menda ...................... 313/512
2007/0228942 A1* 10/2007 Akai et al. .................. 313/504
2008/0303418 A1* 12/2008 Fujita et al. ................. 313/504

FOREIGN PATENT DOCUMENTS

JP  03-261091  11/1991
JP  2001-345175  12/2001

* cited by examiner

*Primary Examiner*—Bumsuk Won
(74) *Attorney, Agent, or Firm*—Antonelli, Terry, Stout & Kraus, LLP.

(57) ABSTRACT

The invention mainly provides an organic EL display device which can prevent the intrusion of moisture into an organic EL film by applying a thin film technique to the display device. For this end, the organic EL display device is configured such that (1) a lower electrode and an upper electrode are formed with an organic EL film sandwiched therebetween, an SiOxNy film which functions as a moisture proof film is formed to cover the upper electrode by a plasma CVD method, wherein the moisture proof film protects the organic EL film from moisture, (2) an inspection-use conductive film is formed on the moisture proof film 13, and (3) the presence or the non-presence of a defect in the moisture proof film is detected by applying a DC or AC voltage between the inspection-use conductive film and the upper electrode.

19 Claims, 6 Drawing Sheets

ORGANIC ELECTROLUMINESCENT DISPLAY DEVICE HAVING A MOISTURE-PROOF FILM

CROSS-REFERENCE TO RELATED APPLICATIONS

The disclosure of Japanese Patent Application No. 2006-187673, filed on Jul. 7, 2006 including the claims, the specification, the drawings and the abstract is incorporated herein by reference in its entirety.

BACKGROUND

1. Field of the Invention

The present invention relates to a sealing technique for preventing the deterioration of an organic EL material due to moisture in an organic EL display device.

2. Description of Related Art

Although a main stream of the conventional display device is a CRT, a liquid crystal display device, a plasma display device and the like which are flat display devices have been practically used in place of the CRT and a demand for such flat display devices is increasing. In addition to these display devices, developments and efforts for practical use of a display device which uses organic electro luminescence (hereinafter, referred to as organic EL display device) and a display device which arranges electron sources utilizing field emission in a matrix array and phosphors arranged on an anode is radiated with light thus forming an image (hereinafter referred to as FED display device) have been also in progress.

The organic EL display device has features such as (1) the organic EL display device is of a self-luminous type compared with liquid crystal and hence, a backlight is unnecessary, (2) voltage necessary for emission of light is low, that is, equal to or below 10V and hence, the power consumption can be decreased, (3) compared to a plasma display device or an FED display device, the vacuum structure is unnecessary thus the organic EL display device is suitable for achieving the reduction of weight and the reduction of thickness, (4) a response time is short, that is, several micro seconds and hence, the organic EL display device exhibits the excellent motion picture property, and (5) the viewing angle is 170 degrees or more.

However, when moisture or oxygen is present around the EL material, the oxidation of the EL material is accelerated thus generating dark spots whereby the light transmitting property is deteriorated. To cope with such a drawback, there has been adopted a method in which, after formation of lines, switching elements, organic EL layers and the like on a substrate, a glass substrate or a sealing cap for sealing is mounted on a back surface of the substrate to form a sealed space, and a desiccant is arranged in the inside of the sealed space. Due to such a method, it is possible to remove the moisture from the inside of the display device in which the organic EL material is formed.

FIG. 12 is a schematic cross-sectional view showing an example in which lines, switching elements, organic EL layers and the like are sealed using a sealing can 15. Although an undercoat 2, lines, switching elements and the like are formed on a substrate 1, these parts are omitted from FIG. 12. An organic EL film 11 emits light by applying a voltage between a lower electrode 9 and an upper electrode 12. The sealing can 15 is mounted on the substrate 1 using an adhesive material 16 so as to maintain the inside of a display device in a hermetic state. To remove moisture from the inside of the display device, a desiccant 19 is mounted on the inside of the sealing can 15. The desiccant 19 is fixed to the inside of the sealing can 15 using a pressure-sensitive adhesive double-coated tape 191, for example. As a material of the sealing can 15, for example, metal such as stainless steel can be used. As a material of the desiccant 19, activated carbon, zeolite, silica gel or the like can be used.

FIG. 13 shows an example in which the inside of a display device is hermetically maintained using a back glass plate 17. To ensure a space between the back glass plate 17 and the substrate 1, the back glass plate 17 is mounted on the substrate 1 by way of a sealing frame 18 using a sealing material 16 thus hermetically sealing the inside of the display device. In this case, a desiccant 19 is fixed to the inside of the back glass plate 17 using a pressure-sensitive adhesive double-coated tape 191 or the like. A material of the desiccant 19 may be substantially equal to the desiccant used in the case of the sealing can 15.

The above-mentioned related arts are described in, for example, patent document 1, patent document 2 and the like.

[Patent document 1] JP-A-3-261091
[Patent document 2] JP-A-2001-345175

SUMMARY

Even with the above-mentioned structure which prevents the intrusion of moisture using the sealing can, the back glass or the like, the hermetic sealing is extremely difficult. Further, although the organic EL substrate is sealed after completion of the substrate, the organic EL is weak to heat thus giving rise to a drawback that a highly reliable sealing material such as frit glass which requires high temperature for melting cannot be used as a sealing material. Further, when a defect exists in the sealing, moisture intrudes the inside of the display device thus deteriorating the property of the organic EL. To cope with such a drawback, the desiccant is arranged in the inside of the display device. However, as long as the defect exists in the sealing, it is difficult to sufficiently cope with the drawback.

Further, advantages of the organic EL display device lie in that a thickness of the display device can be reduced and a weight of the display device can be reduced. However, when the sealing can or the back glass substrate is used for preventing the intrusion of moisture as in the case of the related art, the thickness of the display device is increased and the weight of the display device is also increased corresponding to the use of the sealing can or the back glass substrate.

Further, when the desiccant for removing moisture is used in the inside of the display device, it is necessary to take a thickness of the display device corresponding to the use of the desiccant into consideration and, at the same time, the weight of the display device is also increased. In this manner, in an attempt to prevent the intrusion of moisture or to remove moisture using the sealing can, the back glass substrate or the like, advantages of the organic EL display device is halved from a view point of thickness and weight of the display device.

The invention has been made to overcome the above-mentioned drawbacks of the related art and it is an object of the invention to provide an organic EL display device which can protect an organic EL film from moisture with high reliability. Further, the invention can sufficiently make use of an advantage of the organic EL display device that the organic EL display device is thin and light-weighted. Specific means are explained hereinafter.

(1) In an organic EL display device in which organic EL films are arranged on a substrate in a matrix array, each organic EL film is provided between a lower electrode and an upper electrode, and the organic EL film emits light when a voltage is applied between the lower electrode and the upper electrode thus forming an image on a screen of the substrate, the upper electrode and the lower electrode are connected to terminals for supplying the voltage, a moisture-proof film is formed to cover the upper electrode, a conductive film is formed on the moisture-proof film, and the conductive film has terminals for supplying the voltage.

(2) In the organic EL display device having the means (1), the substrate is a glass substrate.

(3) In the organic EL display device having the means (1), the organic EL display device is of a bottom-emission type.

(4) In the organic EL display device having the means (1), the organic EL display device is of a top-emission type.

(5) In the organic EL display device having the means (1), the conductive film is a transparent conductive film.

(6) In the organic EL display device having the means (1), the conductive film is an ITO film.

(7) In the organic EL display device having the means (1), the moisture-proof film is a transparent insulation film.

(8) In the organic EL display device having the means (1), the moisture-proof film is made of SiOxNy in which suffixes x and y indicate arbitrary numbers.

(9) In the organic EL display device having the means (1), the moisture-proof film adopts the multi-layered structure.

(10) In the organic EL display device in which organic EL films are arranged on a substrate in a matrix array, each organic EL film is provided between a lower electrode and an upper electrode, and the organic EL film emits light when a voltage is applied between the lower electrode and the upper electrode thus forming an image on a screen of the substrate, the upper electrode and the lower electrode are connected to terminals for supplying the voltage, a moisture-proof film is formed to cover the upper electrode, a conductive film is formed on the moisture-proof film, the conductive film has terminals for supplying the voltage, and a predetermined electric potential is supplied to the conductive film when the organic EL display device is operated.

(11) In the organic EL display device having the means (10), the predetermined electric potential is equal to an electric potential of a frame of the display device.

(12) In the organic EL display device having the means (10), the predetermined electric potential is equal to an electric potential which is applied to the upper electrode.

(13) In the organic EL display device in which organic EL films are arranged on a substrate in a matrix array, each organic EL film is provided between a lower electrode and an upper electrode, and the organic EL film emits light when a voltage is applied between the lower electrode and the upper electrode thus forming an image on a screen of the substrate, the upper electrode and the lower electrode are connected to terminals for supplying the voltage, a moisture-proof film is formed to cover the upper electrode, a conductive film is formed on the moisture-proof film, the conductive film has terminals for supplying the voltage, and a mechanical protecting member is formed within a range in which the organic EL films are formed.

(14) In the organic EL display device having the means (13), the mechanical protecting member is a member made of an organic resin which is formed by potting.

(15) In the organic EL display device having the means (13), the mechanical protecting member is a can-like metal member.

(16) In the organic EL display device having the means (13), the mechanical protecting member includes a glass-plate-like protecting member.

(17) In the organic EL display device having the means (13), the mechanical protecting member includes a transparent-plastic-plate-like protecting member.

(18) In the organic EL display device having the means (13), the inside of the can-like metal member which is the mechanical protecting member is hermetically sealed, and a desiccant is arranged in the inside of the can-like metal member.

(19) In the organic EL display device having the means (13), the inside of the mechanical protecting member including the glass-plate-like member is hermetically sealed, and a desiccant is arranged in the inside of the mechanical protecting member.

Followings are advantages obtained by the above-mentioned means.

According to any one of means (1) to (9), the moisture-proof film is formed to cover the organic EL film and the upper electrodes formed on the organic EL film, and the inspection-use conductive film is formed. Accordingly, the use of the sealing can or the back glass substrate for sealing becomes no more inevitable and hence, it is possible to make full use of an advantage of the organic EL display device that the organic EL film is thin and light-weighted. Further, by applying a DC voltage or an AC voltage between the upper electrode and the inspection-use conductive film on the organic EL film, the presence or the non-presence of the defect of the moisture-proof film can be inspected and hence, it is possible to prevent the shipping of a defective product. Further, depending on the inspection method, it is possible to detect the position of the defect and hence, the defect can be repaired.

According to any one of means (10) to (12), the predetermined voltage is applied to inspection-use conductive film during the period that the organic EL display device is operated and hence, there is no possibility that the organic EL display device is influenced by the inspection-use conductive film and becomes unstable.

According to anyone of means (13) to (19), the mechanical protective member is formed on the surface on which the organic EL film is formed in the organic EL display device and hence, it is possible to prevent the element for image display such as the organic EL film from being mechanically ruptured. Further, according to means (18) and (19), it is possible to provide the double protecting means against moisture by setting the moisture-proof film in addition to the conventional sealing means, the reliability of the display device is further enhanced.

DETAILED DESCRIPTION OF THE INVENTION

The invention is disclosed in detail in conjunction with embodiments.

Embodiment 1

Figure 1:
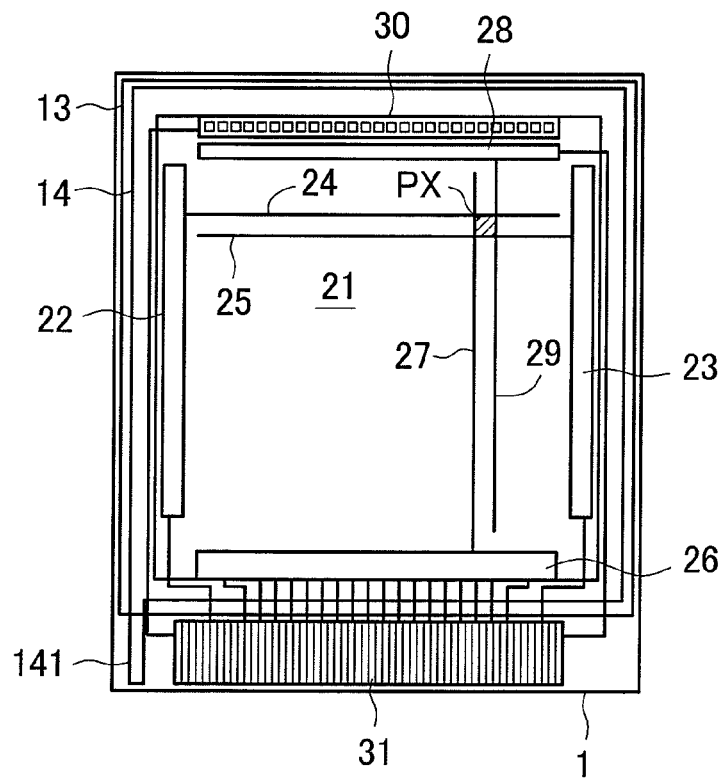
FIG. 1 is a plan view of a display device of the invention.

FIG. 1 is a plan view of a substrate according to this embodiment. A display region 21 is formed in a most portion of the center of the substrate. Scanning signal drive circuits 22, 23 are arranged on both sides of the display region.

Gate signal lines extend from the respective scanning signal drive circuits 22, 23. The gate signal lines 24 which extend from the left-side scanning signal drive circuit 22 and the gate signal lines 25 which extend from the right-side scanning signal drive circuit 23 are arranged alternatively.

A video signal drive circuit 26 is arranged on a lower side the display region 21, and data signal lines 27 extend from the video signal drive circuit 26 to the display-region-21 side. A current supply bus line 28 is arranged on the display region 21, and current supply lines 29 extend from the current supply bus line 28 to the display-region-21 side.

The data signal lines 27 and the current supply lines 29 are alternately arranged. Due to such an arrangement, one pixel PX is formed in each region surrounded by the data signal line 27, the current supply line 29, the gate signal line 24 and the gate signal line 25.

A group of contact holes 30 is formed on an upper side of the display region. The group of contact holes 30 are provided for electrically connecting upper electrodes 12 of organic EL films 11 which are formed on the whole area of the display region to lines which are formed below an insulation film and extend to terminals 31. The terminals 31 are formed on a lower side of display region, and a scanning signal, a data signal, an anode potential and a cathode potential for the organic EL films 11 are supplied from the terminals 31.

A moisture-proof film 13 for preventing the intrusion of moisture from the outside is formed on the whole surface of the substrate except for a terminal portion. The moisture-proof film 13 needs to be an insulation layer. The moisture-proof film 13 is required to possess a sufficient a sealing effect for preventing the moisture from intruding into the organic EL film 11. An SiOxNy film is suitable for acquiring such a sealing effect. Here, suffixes x and y are arbitrary numbers. That is, an $SiO_2$ film or a SiN film may be used in a single form. However, it must be noted that when only the $SiO_2$ film is used, a pin hole is liable to occur, while when only the SiN film is used, the moisture-proof film is liable to be easily colored. The SiOxNy film having a thickness of 1 μm to 2 μm is formed by a plasma-CVD method. In this manner, the moisture-proof film has a large thickness to prevent the occurrence of a film defect. In this case, to prevent the adhesion of the SiOxNy film to the terminal portion, the terminal portion is masked in performing the plasma CVD.

Next, an inspection-use conductive film 14 having a thickness of 30 nm or more is formed on an approximately whole surface of the moisture-proof film 13 by sputtering, for example. To prevent the adhesion of the inspection-use conductive film 14 to the terminal portion, the sputtering or the like is performed after masking the terminal portion. However, it is necessary to form a terminal 141 for the inspection-use conductive film and hence, the terminal is formed by a sputtering method.

Figure 2:
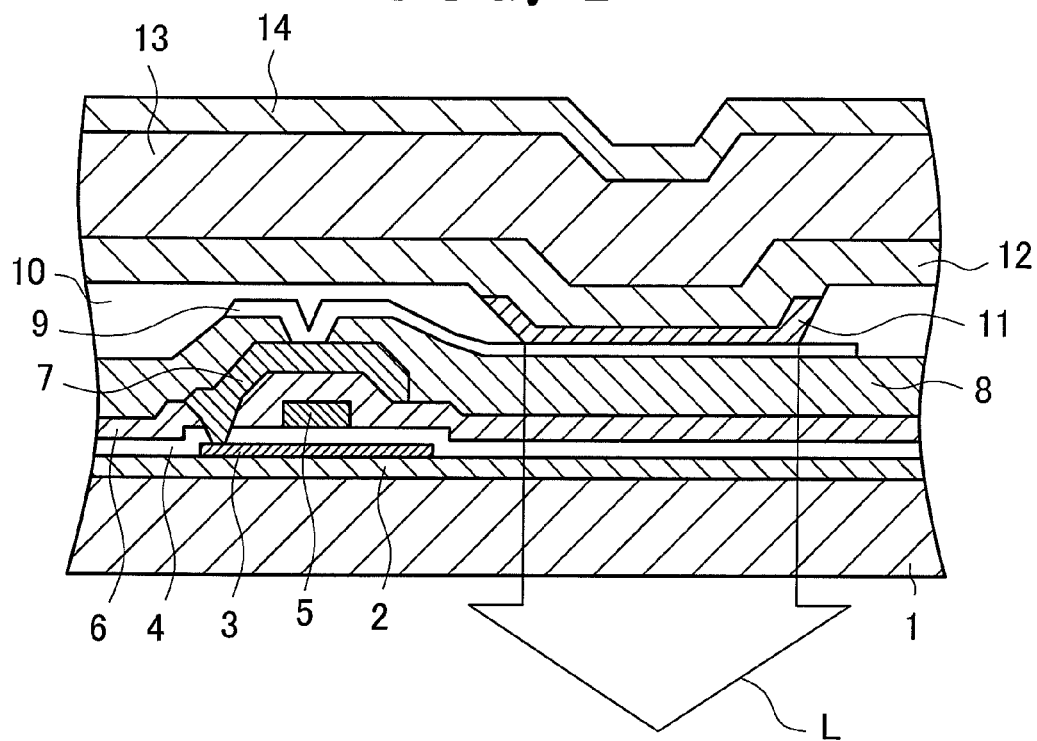
FIG. 2 is a cross-sectional view of a pixel according to an embodiment 1.

FIG. 2 is a cross-sectional view of a pixel PX portion shown in FIG. 1, and shows the cross-sectional structure of a so-called bottom-emission-type organic EL display device. FIG. 2 is a cross-sectional view of the pixel portion of the display device which drives organic EL using a thin film transistor (TFT) as a switching element. In FIG. 2, an undercoat 2 is applied to an upper surface of a glass substrate 1. The undercoat 2 plays a role of preventing impurities from a glass substrate 1 from contaminating TFTs and the organic EL. A semiconductor layer 3 is formed of a source portion, a channel portion and a drain portion. A gate insulation film 4 is formed to cover the semiconductor layer 3, a gate electrode 5 is formed on the gate insulation film 4, and an interlayer insulation film 6 is formed to cover the gate electrode 5. While an SD line 7 is formed on the interlayer insulation film 6, the SD line 7 is connected with the source portion or the drain portion formed on the semiconductor layer 3 via a through hole formed in the interlayer insulation film 6 thus playing a role to take out a signal from the TFT. A passivation film 8 is formed to cover the SD line 7 thus protecting the whole TFT. While a transparent electrode ITO which constitutes a lower electrode 9 of an organic EL film 11 is formed on the passivation film 8, the transparent electrode is connected with the SD line 7 via a through hole formed in the passivation film 8.

Further, on the transparent electrode and the passivation film 8, a bank 10 for separating respective pixels from each other is formed. On a portion of the transparent electrode where the bank 10 is not formed, the organic EL film 11 which constitutes a light emitting portion is stacked. Then, a metal layer which constitutes an upper electrode 12 is formed on the organic EL film 11. The organic EL film 11 is generally formed of a plurality of layers and emits light when a voltage is applied between a cathode and an anode. Here, the lower electrode 9 is formed of a transparent electrode, and all of the passivation film 8, the interlayer insulation film 6 and the undercoat 2 are transparent and hence, light emitted from the organic EL film 11 advances in the direction indicated by an arrow L shown in FIG. 2 (bottom emission). On the other hand, light which advances toward the upper electrode 12 is reflected on metal which constitutes an upper electrode 12 and is also advances in the direction indicated by an arrow L shown in FIG. 2.

Then, on the upper electrode 12, the SiOxNy film having a thickness of 1 μm to 2 μm which constitutes the moisture-proof film 13 is formed by a plasma CVD method. On the moisture-proof film 13, the inspection-use conductive film 14 having a thickness of 30 nm or more is formed by sputtering. The inspection-use conductive film 14 may be formed of any conductive film provided that the conductive film can exist stably in the atmosphere. For example, an ITO film, an IZO film, a $WO_3$ film, an $MoO_3$ film or the like is used as the moisture-proof film 13.

Figure 3:
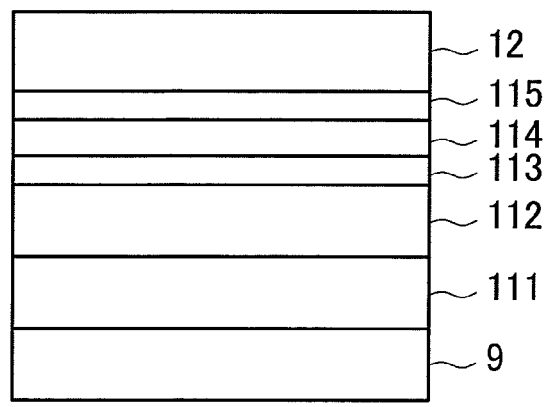
FIG. 3 is view showing the film structure of an organic EL film according to the embodiment 1.

FIG. 3 is a schematic cross-sectional view showing one example of the organic EL film 11 portion which constitutes the light emitting portion. In FIG. 3, on the lower electrode 9 which constitutes the transparent electrode, a hole injection layer 111 having a thickness of 50 nm, a hole transport layer 112 having a thickness of 40 nm, a light emitting layer 113 having a thickness of 20 nm, an electron transport layer 114 having a thickness of 20 nm and an electron injection layer 115 having a thickness of 0.5 nm are formed. The upper electrode 12 is formed of a sputter film made of Al having a thickness of 150 nm. The organic EL film 11 is degraded under the presence of moisture and deteriorates the light emitting property and hence, it is necessary to protect the organic EL film 11 such that the organic EL film 11 is not exposed to moisture. The moisture-proof film 13 which is formed on the upper electrode 12 of the organic EL film 11 according to the invention prevents the moisture from intruding into the organic EL film 11.

Conventionally, with respect to the intrusion of moisture into the organic EL film 11, the intrusion of moisture into the inside of the display device is prevented by mounting the sealing can 15, the back glass plate 17 or the like on the back of the substrate 1 on which the organic EL film 11, the TFTs for switching and the like are formed. However, mounting of the sealing can 15 or mounting of the back glass plate 17 increases a total thickness of the display device and, at the same time, increases a weight of the display device. According to the invention, by completely covering the organic EL film 11 and the like formed on the substrate 1 with the moisture-proof film, the sealing can 15, the back glass plate 17 or the like which is formed on the back of the substrate 1 can be omitted and hence, the total thickness of the display device can be decreased and, at the same time, the weight of the display device can be decreased thus allowing the organic EL to exhibit intrinsic advantages thereof.

The moisture-proof film 13 is, as mentioned previously, the SiOxNy film which is formed by the plasma CVD method and has the film thickness of 1 µm to 2 µm. Although the SiOxNy film exhibits the excellent moisture-proof property, when the moisture-proof film 13 suffers from a defect such as a pin hole, water intrudes into the organic EL film 11 from the defect portion and deteriorates the organic EL film 11.

In the invention, the inspection-use conductive film 14 is further formed on the moisture-proof film 13. As shown in FIG. 2, the organic EL film 11 and other layers arranged below the organic EL film 11 have the whole surfaces thereof covered with the upper electrode 12 of the organic EL film 11. The moisture-proof film 13 is formed to cover the upper electrode 12, and the inspection-use conductive film 14 is formed to cover the moisture-proof film 13. According to the invention, with the use of the inspection-use conductive film 14 and the above-mentioned upper electrode 12, it is possible to inspect whether a defect exists or not in the moisture-proof film 13.

Figure 4:
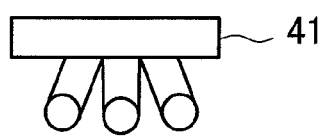
FIG. 4 is a conceptual view of an inspection method to which the invention is used.
Figure 4:
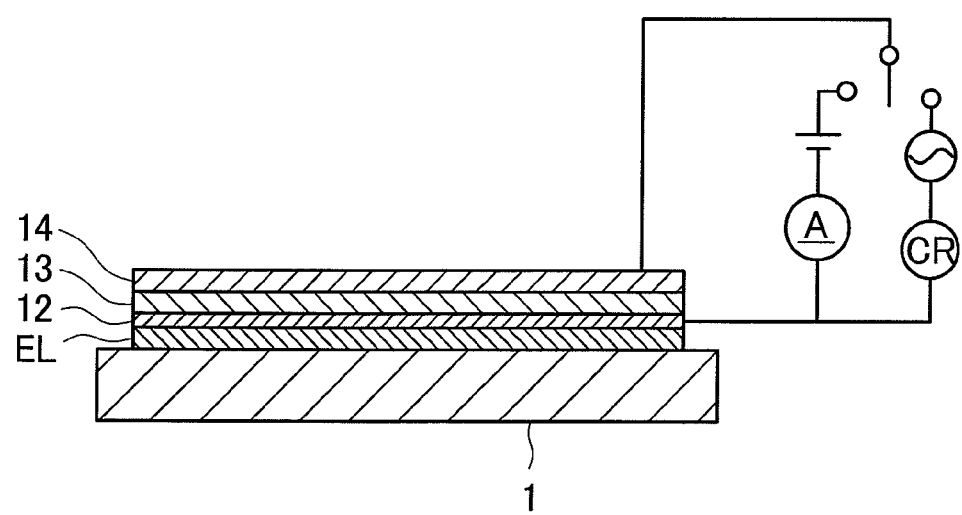

According to the constitution of the invention, as shown in FIG. 4, at least three kinds of inspection methods are applicable to the organic EL display device. In the first inspection method is, as shown in FIG. 4, an DC voltage is applied between the upper electrode 12 and the inspection-use conductive film 14. Since the SiOxNy film possesses the excellent insulation property and, usually, there is no possibility that the DC current flows in the SiOxNy film. However, when the defect exists in a portion of the SiOxNy film, the DC current flows in such a defect. Accordingly, the presence or the non-presence of the defect can be easily detected.

In the second inspection method is, as shown in FIG. 4, an AC voltage is applied between the upper electrode 12 and the inspection-use conductive film 14 and phase difference between impedance and a current voltage is measured using a CR meter thus detecting the presence or the non-presence of a defect in the SiOxNy film which constitutes the moisture-proof film 13. Here, if there is no defect, the phase difference between the voltage and the current is 90 degrees. Then, if the defect exists, the phase difference rapidly approaches zero. An advantage of the second inspection method compared to the first inspection method lies in that by measuring the frequency property of the phase difference between the impedance and the current voltage, it is possible to estimate the number and the degree of defects or the like in the moisture-proof film 13 can be estimated to some extent. Further, although the large capacitance exists due to the structure which sandwiches the moisture-proof film 13 between the upper electrode 12 and the inspection-use conductive film 14, by inspecting the impedance or the capacitance using the second inspection method, the SiOxNy film can be controlled.

The third inspection method is, as shown in FIG. 4, a so-called PHEMOS inspection method. The PHEMOS inspection method has been already used in a technical field of semiconductors. That is, when a DC voltage is applied between the upper electrode 12 and the inspection-use conductive film 14, if a defect exists in the moisture-proof film 13, at such a defect portion, an electric current flows between the inspection-use conductive film 14 and the organic EL film 11, and extremely weak infrared rays are radiated from a portion where the electric current flows. The PHEMOS inspection method detects such extremely weak infrared rays with a CCD camera 41 and detects the presence of the defect. An advantage for using the PHEMOS inspection method in the inspection of the invention lies in that it is possible to detect not only the presence of the defect but also a portion of the moisture-proof film 13 where the defect exists. Since the PHEMOS inspection method can detect the position of the defect, the defect can be repaired and, at the same time, a step which generates such a defect can be also investigated.

As described above, according to the invention, before shipping a product, it is possible to inspect whether a defect exists in a moisture-proof effect of the product or not thus remarkably enhancing the reliability of the product. Further, depending on the inspection method, it is also possible to control the position of the defect and, further, steps relevant to the manufacture of the moisture-proof film 13.

On the other hand, when organic EL display device is operated as a display device, the inspection-use conductive film 14 is unstable at a float potential and hence, the operation of the organic EL is adversely influenced. In the invention, after the inspection of defects before shipping, by setting the inspection-use conductive film 14 at a ground potential (a potential equal to a potential of the frame) or as a potential equal to an upper potential of the organic EL film 11, the stability of the operation can be obviated. Here, a potential is supplied to the inspection-use conductive film 14 from an inspection-use conductive film terminal 141. The inspection-use conductive film terminal 141 may be simultaneously connected with other terminals at the time of mounting a usual flexible printed circuit board and a predetermined voltage may be applied to the inspection-use conductive film terminal 141.

According to the invention, to apply the DC voltage or the AC voltage to the inspection-use conductive film 14 during the inspection or to apply the ground potential (the frame potential) or the like to the inspection-use conductive film 14 during the operation, an inspection conductive film terminal 141 is formed on the inspection-use conductive film 14. The inspection conductive film terminal 141 is formed on the same side on which other terminals of the display device are formed. Due to such a constitution, the inspection conductive film terminal 141 can be simultaneously connected when other terminals are connected to an external circuit by TAB (Tape Automated Bonding) or the like.

Embodiment 2

In the embodiment 1, a SiOxNy film having a film thickness of 1 μm or 2 μm is formed as a moisture-proof film 13 by a plasma CVD method. The most important point in carrying out the invention lies in the prevention of occurrence of a defect such as a pin hole in a moisture-proof film 13. By forming the moisture-proof film 13 in two stages, the probability of the occurrence of the defect can be largely reduced. That is, by continuously stacking same film under the same conditions, the pin holes are continuously formed at the same place. However, even when the same film is stacked, a step is intermitted once and, thereafter, stacking of the film is started, it is possible to lower the probability that the pin holes are formed at the same place. That is, even with the film having the same thickness of 2 μm, by stacking films having a thickness of 1 μm respectively, the probability of the existence of the pin hole which penetrates the film in the thickness direction of the film can be decreased. That is, with respect to the stacked film, even when the pin holes are formed in the film, it is possible to maintain a moisture proof effect provided that the pin holes are not present at the same place.

Even when the same film is used, by forming the film using a plurality of divided films, the probability of the occurrence of the pin hole can be reduced and hence, by forming films having different properties in a plurality of layers, the probability of the occurrence of the pin hole can be further reduced. For example, after stacking a SiOxNy film having a thickness of 1 μm as the moisture-proof film 13, an SiO2 film having a film thickness of 1 μm is formed by sputtering. Although the pin hole occurs due to various causes, these causes may differ from each other depending on the film forming method. For example, a cause of occurrence of the pin hole attributed to a plasma CVD method and the cause of occurrence of pin hole attributed to sputtering differ form each other and hence, by forming the film using different processes, the probability that the pin holes occur at the same place becomes extremely small.

The cause of occurrence of pin hole also differs depending on materials of stacked films. For example, even film are formed by the same plasma CVD method, compared to the formation of the same film having a thickness of 2 μm, by forming a SiOxNy film having a thickness of 1 μm and by forming another film, for example, an SiN film having a thickness of 1 μm, the probability that the pin hole is formed at the same place becomes small.

By forming the moisture-proof film 13 into a plurality of divided layers as in the case of this embodiment, it is possible to prevent the pin hole from penetrating the moisture-proof film 13 thus enhancing a moisture-proof-effect.

Embodiment 3

In the embodiment 1, the explanation has been made by taking the so-called bottom-emission-type organic EL display device as an example. However, the invention is also applicable to a so-called top-emission-type organic EL display device. An advantage of the top-emission-type organic EL display device compared to the bottom-emission-type organic EL display device lies in that an area of a light emitting portion can be increased.

Figure 5:
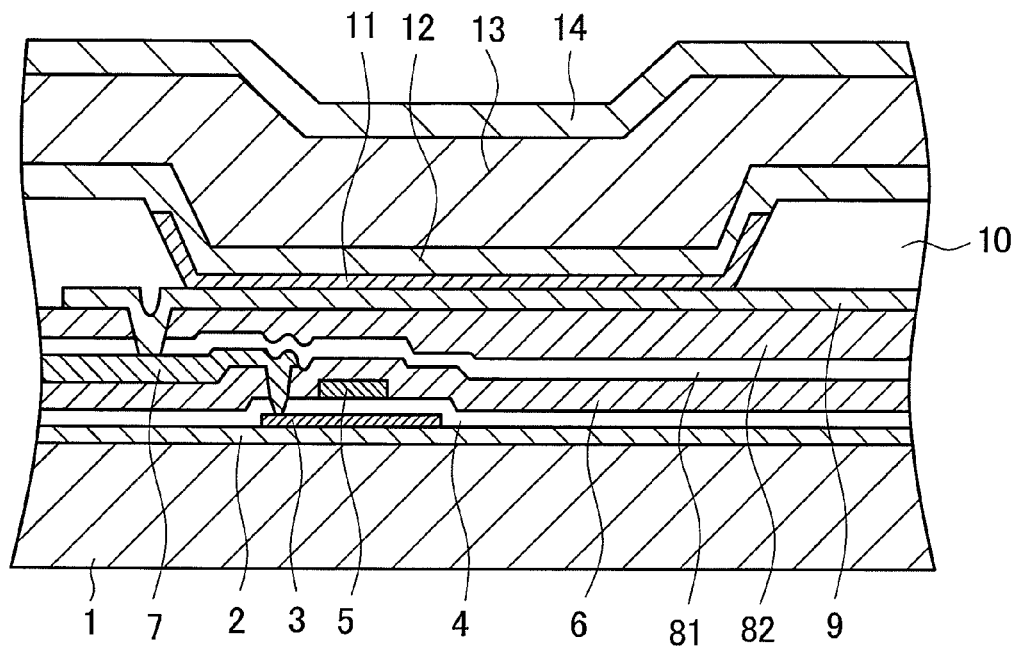
FIG. 5 is a cross-sectional view of a pixel according to an embodiment 3.

FIG. 5 is a cross-sectional view of a pixel PX portion shown in FIG. 1 in the top-emission-type organic EL display device. In FIG. 5, up to the formation of a passivation film 8, the top-emission-type organic EL display device has the same structure as the bottom-emission-type organic EL display device shown in FIG. 2. In FIG. 5, to ensure the large emitting portion by making use of the advantages of the top-emission-type organic EL display device, the light emitting portion is formed also on a TFT. However, to form the light emitting portion also above the TFT, it is necessary to form the lower electrode 9 of the organic EL also above the TFT and, at the same time, it is necessary to level the lower electrode 9. To level the lower electrode 9, it is necessary to level the passivation film 8 which becomes a background of the lower electrode 9. Accordingly, the passivation film adopts the two-layered structure in which an inorganic film made of SiN or the like is used as a lower layer 81 and an organic film is used as an upper layer 82 thus forming a leveled film.

The lower electrode shown in FIG. 5 constitutes a cathode of an organic EL film 11 and hence, the lower electrode is made of a material which possesses a small work function, for example, Al, Al alloy or the like. The organic EL film 11 is formed on the lower electrode by a vapor deposition method or the like. Although the organic EL film 11 is generally formed of a stacked film, the stacked structure differs from the stacked structure adopted by the bottom-emission-type organic EL display device. An upper electrode 12 is formed on the organic EL film 11. In the top-emission-type organic EL display device, light is radiated through an anode and hence, the upper electrode is required to be transparent. Accordingly, as an anode material, ITO, IZO, WO3, MoO3 or the like is preferably used.

A moisture-proof film 13 having a thickness of approximately 1 μm to 2 μm is formed on the upper electrode 12. The manner of forming the moisture-proof film 13 is substantially equal to the manner of forming the moisture-proof film 13 in the embodiment 1. However, in the top-emission-type organic EL display device, it is a prerequisite that the moisture-proof film 13 is transparent. An SiOxNy used in the embodiment 1 is transparent and hence, the SiOxNy is a preferable material for the moisture-proof film 13 also in this embodiment. Since SiO2, SiN or the like is also transparent, these materials can be also used for forming the moisture-proof film 13 in this embodiment. However, it is necessary to pay attention to the use of SiN since SiN brings about coloring of the moisture-proof film 13 depending on film forming conditions.

An inspection-use conductive film 14 is formed on the moisture-proof film 13 in the same manner as the embodiment 1. In the top-emission-type organic EL display device, however, it is a prerequisite that the inspection-use conductive film 14 is formed of a transparent electrode. To satisfy this requirement, ITO, IZO, WO3, MoO3 or the like is preferably used. Here, in the same manner as the embodiment 1, terminals for inspection are formed on the inspection-use conductive film 14.

Figure 6:
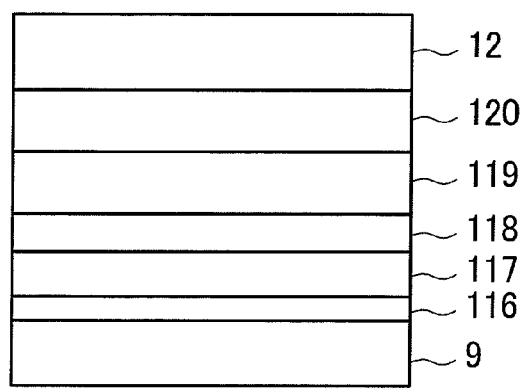
FIG. 6 is a view showing the film structure of an organic EL film according to the embodiment 3.

FIG. 6 shows the film structure of an organic EL film 11 which constitutes a light emitting portion of the top-emission-type organic EL display device. In FIG. 6, an electron injection layer 116 is formed on the SD line layer 7 which constitutes the lower electrode 9. The electron injection layer 116 is, for example, an LiF film having a thickness of 0.5 nm which is formed by a vacuum vapor deposition method. The electron injection layer 116 is provided for facilitating the injection of electrons from a cathode which constitutes the lower electrode 9. An electron transport layer 117 is formed on the electron injection layer 116. The electron transport layer 117 is, for example, a tris (8-quinolinol) aluminum (hereinafter, abbreviated as Alq) having a thickness of 20 nm which is formed by a vacuum vapor deposition method. This layer is provided for efficiently carrying electrons to a light emitting layer 118 with the least resistance. The light emitting layer 118 is formed on the electron transport layer 117. In this light emitting layer 118, electrons and holes are re-coupled to generate the EL light emission. The light emitting layer 118 is, for example, formed of a co-vapor deposition film having a thickness of 20 nm which is made of Alq and quinacridone (abbreviated as Qc). A vapor-deposition speed ratio of Alq and Qc is 40:1. A hole transport layer 119 is formed on the light emitting layer 118. The hole transport layer 119 is provided for efficiently carrying holes supplied from the anode to the light emitting layer 118 with the least resistance. The hole transport layer 119 is formed of an α-NPD film having a thickness of 50 nm which is formed by vapor deposition. A hole injection layer 120 is formed on the hole transport layer 119. The hole injection layer 120 is provided for facilitating the injection of holes from the anode. The hole injection layer 120 is a copper phthalocyanine film having a thickness of 50 nm which is formed by vapor deposition. An upper electrode 12 which constitutes the anode is formed on the hole injection layer 120. Here, there may be a case in which a transparent metal oxide having a thickness of 15 nm is formed as a buffer layer by an EB deposition method or the like between the hole injection layer 120 and the upper electrode 12. As a material of metal oxide of the buffer layer, V2O5, MoO3, WO3 or the like is named. The buffer layer is mainly provided for preventing damages which the organic EL layer 11 receives in sputtering an anode material.

The display device manufactured in this manner is inspected before shipment such that the presence or non-presence of a defect in the moisture-proof film 13 is inspected by making use of the inspection-use conductive film 14 and the upper electrode 12 of the organic EL film 11. The inspection method is equal to the inspection method adopted by the embodiment 1. Further, by providing the multi-layered structure or the multi-layered structure which uses a plurality of materials to the moisture-proof film 13, in the same manner as the embodiment 2, it is possible to prevent the occurrence of the pin hole or the like in the moisture-proof film 13 thus enhancing the reliability of a moisture-proof-effect.

Embodiment 4

In the embodiments 1 to 3, to make use of the advantage of the invention at maximum, the conventionally-used sealing can 15, back glass plate 17 or the like is not used. However, there may be a case that the protect structure which mechanically protects an organic EL film 11 or the like becomes necessary.

Figure 7:
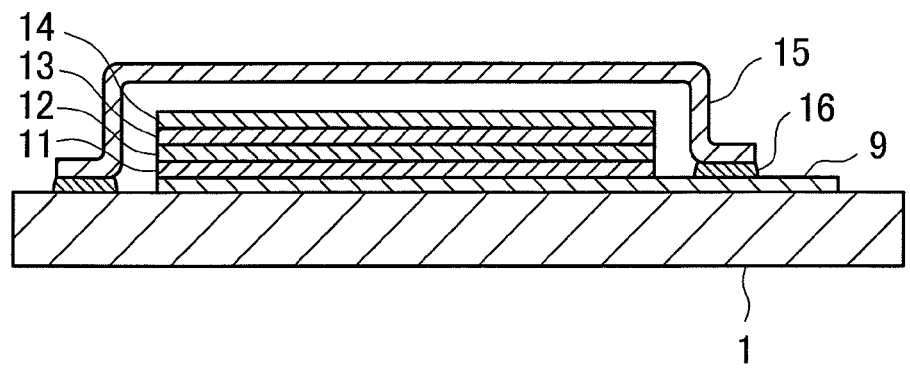
FIG. 7 is a schematic cross-sectional view of an example of an embodiment 4.
Figure 8:
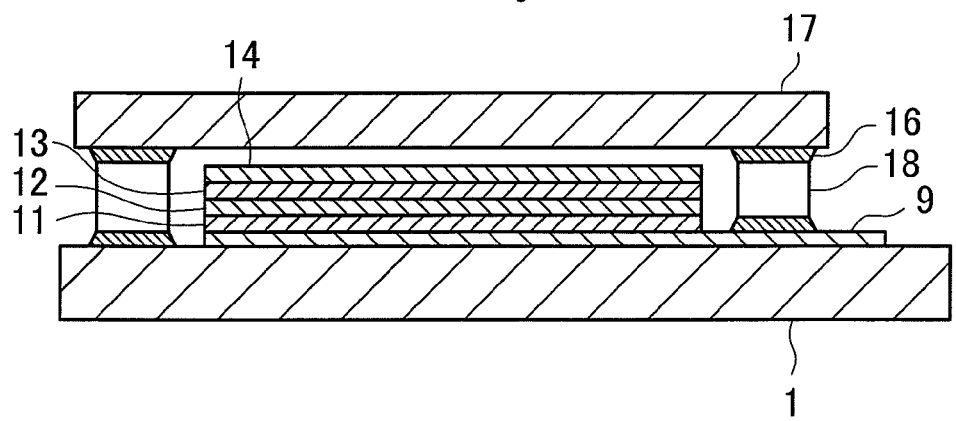
FIG. 8 is a schematic cross-sectional view of another example of the embodiment 4.

In this embodiment, in FIG. 1 which is a plan view of the substrate, around an effective screen part of the display device, a sealing portion is formed in a state that a terminal portion for the inspection-use conductive film is removed from a terminal portion, and a protective member is adhered to the sealing portion. FIG. 7 shows an example which uses a sealing can 15 as the protective member, and FIG. 8 shows an example in which a back transparent plate is used as a protective member. In both FIG. 7 and FIG. 8, a desiccant 19 is not used. In this embodiment, a moisture-proof-effect is mainly performed by a moisture-proof film 13 which is formed on an upper electrode 12 of an organic EL film 11 and hence, it is unnecessary to limit a back transparent plate to a glass plate and the back transparent plate may be made of light-weighted plastic. Further, in FIG. 8, the sealing frame 18 is shown in a columnar shape. However, since a distance between a substrate 1 and the back transparent plate may be set to a small value in this embodiment, spacers in a bead form may be used.

Figure 9:
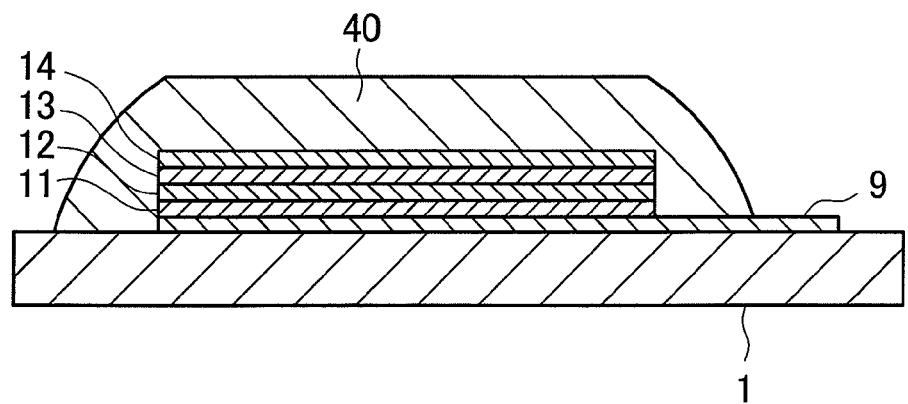
FIG. 9 is a schematic cross-sectional view of still another example of the embodiment 4.

In this embodiment, the moisture-proof-effect is mainly imparted to the moisture-proof film 13 and hence, it is sufficient to provide the mechanical protection to a back surface of the display device. Accordingly, it is unnecessary to use a fixed vessel shown in FIG. 7 or FIG. 8, and an organic resin 40 shown in FIG. 9 may be formed by potting. However, when a thermosetting resin is used as the organic resin 40, it is desirable that the resin 40 is cured at a temperature of 80° C. or less. Further, when an ultraviolet curing resin is used as the organic resin 40, it is necessary to pay an attention such that ultraviolet rays are not radiated to the organic EL film 11. This is because that the ultraviolet rays damage the organic EL film 11. In the bottom-emission-type organic EL display device shown in the embodiment 1, the organic EL film 11 is covered with the upper electrode 12 which is formed of the metal film. Accordingly, when the ultraviolet rays are radiated in the direction of the potting resin 40, the upper electrode 12 protects the organic EL film 11 from ultraviolet rays and hence, the ultraviolet curing resin can be easily used.

Embodiment 5

In the embodiments 1 to 5, the moisture-proof-effect against the organic EL film 11 is imparted only to the moisture-proof film 13 formed on the upper electrode 12 of the organic EL film 11. The invention can make use of the advantage of the organic EL display device that the display device can be made thin and light-weighted at maximum. Further, according to the invention, it is also possible to inspect whether a defect exists in the moisture-proof film 13 or not. However, when the pin hole or the like formed in the moisture-proof film 13 formed on the upper electrode 12 cannot be completely removed, the display device may be sealed by mounting a sealing can 15, a back glass plate 17 or the like on a back surface of the display device thus further enhancing the moisture-proof-effect.

Figure 10:
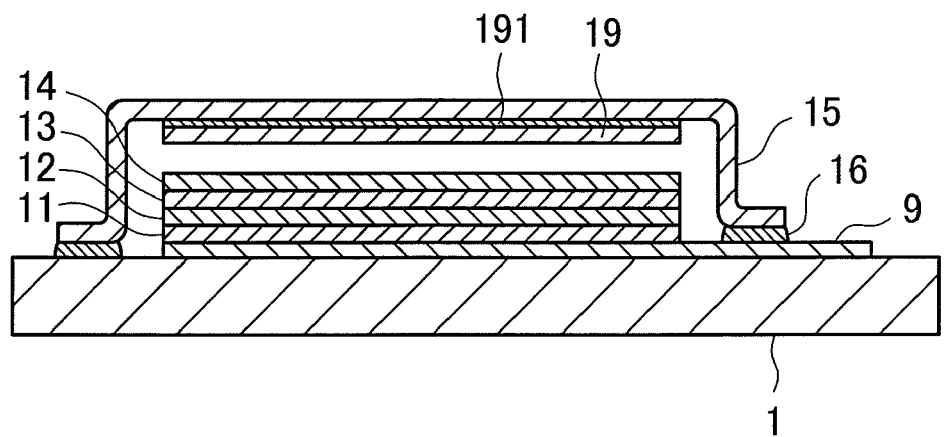
FIG. 10 is a schematic cross-sectional view of the example of the embodiment 4.
Figure 11:
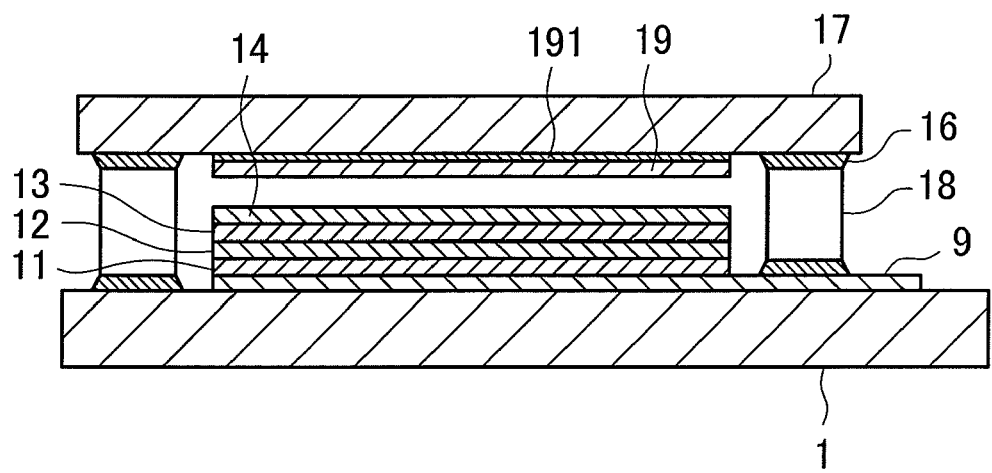
FIG. 11 is a schematic cross-sectional view of another example of the embodiment 4.
Figure 12:
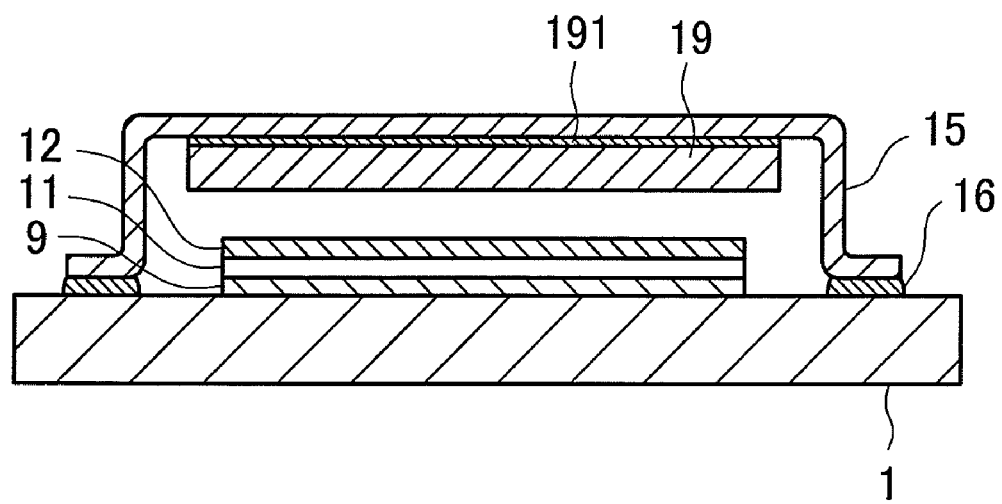
FIG. 12 is a schematic cross-sectional view of a prior art.
Figure 13:
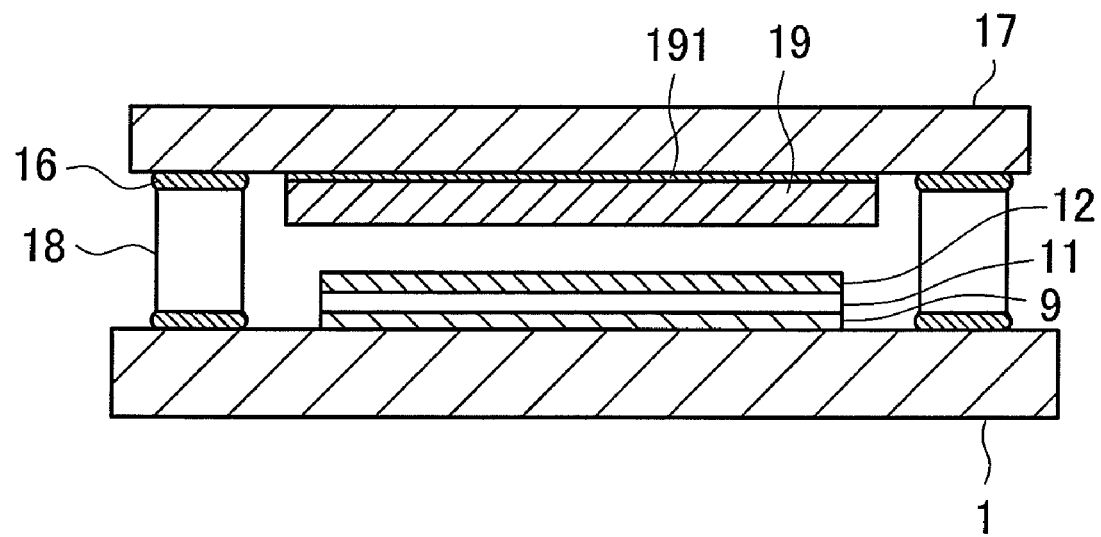
FIG. 13 is a schematic cross-sectional view of another prior art.

FIG. 10 shows a case in which the sealing cam 15 is used as a sealing means, while FIG. 11 shows a case in which the back glass plate 17 is uses as a sealing means. A point which makes this embodiment 5 differs from the embodiment shown in FIG. 7 and FIG. 8 lies in the use of a desiccant 19. The desiccant 19 is provided for removing moisture in the inside of the display device. This embodiment adopts the double sealing structure which performs sealing of the organic EL film 11 using the sealing can 15 or the back glass plate 17 and sealing of the organic EL film 11 using the moisture-proof film 13.

It is needless to say that, also in this embodiment, before mounting the sealing can 15, the back glass plate 17 or the like, the detection of a defect in the moisture-proof film 13 based on the measurement of a DC resistance, the detection of a defect in the moisture-proof film 13 based on the measurement of an impedance and phase difference by applying an AC voltage. The detection of a defect, a defect point or the like in the moisture-proof film 13 based on the control of the moisture-proof film 13 or a PHEMOS method can be carried out.

Compared to the related art, this embodiment has many steps such as the formation of the moisture-proof film 13, and the formation of the inspection-use conductive film 14 and hence, a manufacturing cost is pushed up. However, this embodiment has a large advantageous effect that the reliability which is the most important in evaluating products can be ensured. Further, to take into consideration that the sealing of the organic EL film using the sealing can 15, the back glass plate 17 or the like has technically difficult drawbacks such as the difficulty in using a thermosetting resin of a temperature of 80° C. or more as the sealing material 16, the necessity for preventing ultraviolet rays from being radiated to the organic EL when the ultraviolet curing resin is used, the double sealing structure of this embodiment has a large practical merit.

What is claimed is:

1. An organic EL display device in which organic EL films are arranged on a substrate in a matrix array, each organic EL film is provided between a lower electrode and an upper electrode, and the organic EL film emits light when a voltage is applied between the lower electrode and the upper electrode thus forming an image on a screen of the substrate, wherein the upper electrode and the lower electrode are connected to first terminals for supplying the voltage, a moisture-proof film is formed to cover the upper electrode, a conductive film is formed directly on the moisture-proof film, and the conductive film is connected to a second terminal for supplying the voltage.

2. An organic EL display device according to claim 1, wherein the substrate is a glass substrate.

3. An organic EL display device according to claim 1, wherein the organic EL display device is of a bottom-emission type.

4. An organic EL display device according to claim 1, wherein the organic EL display device is of a top-emission type.

5. An organic EL display device according to claim 1, wherein the conductive film is a transparent conductive film.

6. An organic EL display device according to claim 1, wherein the conductive film is an ITO film.

7. An organic EL display device according to claim 1, wherein the moisture-proof film is a transparent insulation film.

8. An organic EL display device according to claim 1, wherein the moisture-proof film is made of SiOxNy in which suffixes x and y indicate arbitrary numbers.

9. An organic EL display device according to claim 1, wherein the moisture-proof film adopts the multi-layered structure.

10. An organic EL display device in which organic EL films are arranged on a substrate in a matrix array, each organic EL film is provided between a lower electrode and an upper electrode, and the organic EL film emits light when a voltage is applied between the lower electrode and the upper electrode thus forming an image on a screen of the substrate, wherein the upper electrode and the lower electrode are connected to first terminals for supplying the voltage, a moisture-proof film is formed to cover the upper electrode, a conductive film is formed directly on the moisture-proof film, the conductive film is connected to a second terminal for supplying the voltage, and a predetermined electric potential is supplied to the conductive film when the organic EL display device is operated.

11. An organic EL display device according to claim 10, wherein the predetermined electric potential is equal to an electric potential of a frame of the display device.

12. An organic EL display device according to claim 10, wherein the predetermined electric potential is equal to an electric potential which is applied to the upper electrode.

13. An organic EL display device in which organic EL films are arranged on a substrate in a matrix array, each organic EL film is provided between a lower electrode and an upper electrode, and the organic EL film emits light when a voltage is applied between the lower electrode and the upper electrode thus forming an image on a screen of the substrate, wherein the upper electrode and the lower electrode are connected to terminals for supplying the voltage, a moisture-proof film is formed to cover the upper electrode, a conductive film is formed directly on the moisture-proof film, the conductive film is connected to a second terminal for supplying the voltage, and a mechanical protecting member is formed within a range in which the organic EL films are formed.

14. An organic EL display device according to claim 13, wherein the mechanical protecting member is a member made of an organic resin which is formed by potting.

15. An organic EL display device according to claim 13, wherein the mechanical protecting member is a can-like metal member.

16. An organic EL display device according to claim 13, wherein the mechanical protecting member includes a glass-plate-like protecting member.

17. An organic EL display device according to claim 13, wherein the mechanical protecting member includes a transparent-plastic-plate-like protecting member.

18. An organic EL display device according to claim 13, wherein the inside of the can-like metal member which is the mechanical protecting member is hermetically sealed, and a desiccant is arranged in the inside of the can-like metal member.

19. An organic EL display device according to claim 13, wherein the inside of the mechanical protecting member including the glass-plate-like member is hermetically sealed, and a desiccant is arranged in the inside of the mechanical protecting member.

* * * * *